(12) United States Patent
Shim et al.

(10) Patent No.: US 12,156,326 B2
(45) Date of Patent: Nov. 26, 2024

(54) ELECTRONIC DEVICE INCLUDING STACKED PRINTED CIRCUIT BOARDS

(71) Applicant: SAMSUNG ELECTRONICS CO., LTD., Suwon-si (KR)

(72) Inventors: Seungbo Shim, Suwon-si (KR); Junghoon Park, Suwon-si (KR); Jinyoung Bang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 175 days.

(21) Appl. No.: 17/833,184

(22) Filed: Jun. 6, 2022

(65) Prior Publication Data

US 2023/0011480 A1  Jan. 12, 2023

Related U.S. Application Data

(63) Continuation of application No. PCT/KR2022/006341, filed on May 3, 2022.

(30) Foreign Application Priority Data

Jul. 6, 2021 (KR) .................. 10-2021-0088222

(51) Int. Cl.
  *H05K 1/02* (2006.01)
  *H05K 1/11* (2006.01)
  *H05K 1/14* (2006.01)

(52) U.S. Cl.
  CPC .......... *H05K 1/0271* (2013.01); *H05K 1/115* (2013.01); *H05K 1/144* (2013.01); *H05K 2201/09609* (2013.01)

(58) Field of Classification Search
  CPC .. H05K 1/144; H05K 1/145; H05K 2201/041; H05K 2201/042;
  (Continued)

(56) References Cited

U.S. PATENT DOCUMENTS 6,259,039 B1 * 7/2001 Chroneos, Jr. ..... H01R 43/0256
                                                    361/791
10,616,991 B2   4/2020 Yazaki et al.
(Continued)

FOREIGN PATENT DOCUMENTS

CN   209592372    * 11/2019 ............ H01R 12/71
KR   10-1999-0077326    10/1999
(Continued)

OTHER PUBLICATIONS

Search Report dated Aug. 12, 2022 issued in International Patent Application No. PCT/KR2022/006341.

*Primary Examiner* — Paresh Paghadal
(74) *Attorney, Agent, or Firm* — NIXON & VANDERHYE P.C.

(57) ABSTRACT

An electronic device includes: a first printed circuit board (PCB) including a first plate and a first hole formed in the first plate, a second PCB including a second plate, an interposer including a third plate positioned between the first plate and the second plate, a plurality of first vias connecting the first plate and the third plate, a plurality of second vias connecting the second plate and the third plate, and a first reinforcement portion positioned in the first hole to bond the first plate and the third plate.

15 Claims, 15 Drawing Sheets

(58) Field of Classification Search
CPC .......... H05K 2201/10401; H05K 2201/10409; H05K 2201/10378
See application file for complete search history.

(56) References Cited

U.S. PATENT DOCUMENTS

| | | | |
|---|---|---|---|
| 2009/0224404 A1 | 9/2009 | Wood et al. | |
| 2012/0206892 A1 | 8/2012 | Shahoian et al. | |
| 2013/0265731 A1* | 10/2013 | Holma | H05K 1/181 |
| | | | 29/830 |
| 2014/0148020 A1* | 5/2014 | Manushi | H01R 12/52 |
| | | | 439/66 |
| 2015/0146400 A1* | 5/2015 | Huffman | H05K 1/144 |
| | | | 403/299 |
| 2015/0264810 A1* | 9/2015 | Baba | H05K 3/4046 |
| | | | 174/265 |
| 2017/0354031 A1* | 12/2017 | Aoki | H05K 3/341 |
| 2017/0367206 A1* | 12/2017 | Yang | H05K 7/1407 |
| 2018/0153040 A1* | 5/2018 | Wakabayashi | H05K 1/115 |
| 2018/0203490 A1* | 7/2018 | Kim | G06F 1/20 |
| 2018/0235071 A1* | 8/2018 | Barrass | H05K 1/056 |
| 2021/0257758 A1* | 8/2021 | Di Stefano | H01L 24/73 |

FOREIGN PATENT DOCUMENTS

| | | | | |
|---|---|---|---|---|
| KR | 10-0761860 | 9/2007 | | |
| KR | 10-2013-0066729 | 6/2013 | | |
| KR | 10-2017-0112761 | 10/2017 | | |
| KR | 10-2020-0032911 | 3/2020 | | |
| KR | 10-2020-0101018 | 8/2020 | | |
| WO | WO2022100336 | * 5/2022 | ............... | H05K 1/14 |

\* cited by examiner

ELECTRONIC DEVICE INCLUDING STACKED PRINTED CIRCUIT BOARDS

CROSS-REFERENCE TO RELATED APPLICATIONS

This application is a continuation of International Application No. PCT/KR2022/006341 designating the United States, filed on May 3, 2022, in the Korean Intellectual Property Receiving Office and claiming priority to Korean Patent Application No. 10-2021-0088222, filed on Jul. 6, 2021, in the Korean Intellectual Property Office, the disclosures of which are incorporated by reference herein in their entireties.

BACKGROUND

1. Field

The disclosure relates to an electronic device including stacked printed circuit boards (PCBs), for example, an electronic device in which an interposer between a pair of PCBs is bonded to one of the pair of PCBs.

2. Description of Related Art

Techniques for improving the efficiency of mounting space and/or wiring space in an electronic device by efficiently arranging a plurality of electrical/electronic components in the electronic device are being developed.

SUMMARY

Embodiments of the disclosure provide an electronic device for improving the bonding stiffness between a printed circuit board (PCB) and an interposer.

According to various example embodiments, an electronic device includes: a first printed circuit board (PCB) including a first plate and a first hole formed in the first plate, a second PCB including a second plate, an interposer comprising a third plate positioned between the first plate and the second plate, a plurality of first vias connecting the first plate and the third plate, a plurality of second vias connecting the second plate and the third plate, and a first reinforcement portion positioned in the first hole configured to bond the first plate and the third plate.

According to various example embodiments, an electronic device includes: a first printed circuit board (PCB) including a first plate and a first hole formed in the first plate, a second PCB including a second plate, an interposer comprising a third plate positioned between the first plate and the second plate and a first pillar extending from the third plate to be coupled to the first hole, a plurality of first vias connecting the first plate and the third plate, a plurality of second vias connecting the second plate and the third plate, and a first reinforcement portion positioned in the first hole configured to bond the first plate and the first pillar.

According to various example embodiments, it is possible to prevent and/or reduce cracks in signal vias connecting a PCB and an interposer and to prevent and/or reduce a malfunction of an electronic device. Meanwhile, the effects of the electronic device according to various example embodiments are not limited to the above-mentioned effects, and other unmentioned effects can be clearly understood from the following description by one of ordinary skill in the art.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
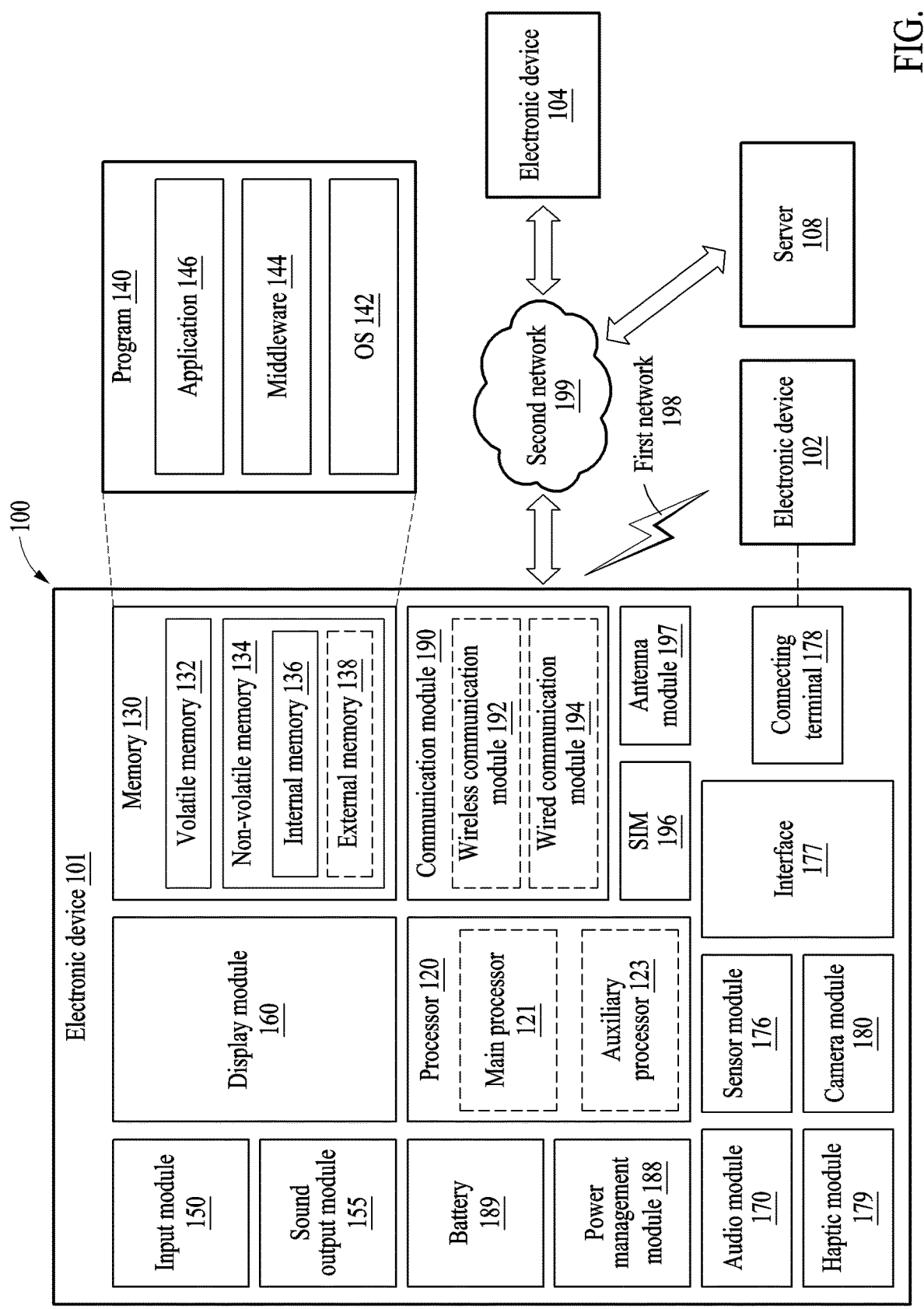
FIG. 1 is a block diagram illustrating an example electronic device in a network environment according to various example embodiments.

Referring to FIG. 1, an electronic device 101 in a network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various example embodiments, at least one (e.g., the connecting terminal 178) of the above components may be omitted from the electronic device 101, or one or more other components may be added in the electronic device 101. In various example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a portion of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a portion of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electrical signal or vice versa. According to an example embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation.

According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a portion of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a portion of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least portion of the function or the service. The one or more external electronic devices receiving the request may perform the at least portion of the function or the service requested, or an additional function or an additional service related to the request, and may transfer an outcome of the performing to the electronic device 101. The electronic device 101 may provide the outcome, with or without further processing of the outcome, as at least portion of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various example embodiments may be one of various types of electronic devices. The electronic device may include, for example, a portable communication device (e.g., a smartphone), a computer device, a portable multimedia device, a portable medical device, a camera, a wearable device, a home appliance device, or the like. According to an example embodiment of the disclosure, the electronic device is not limited to those described above.

It should be appreciated that various example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various example embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
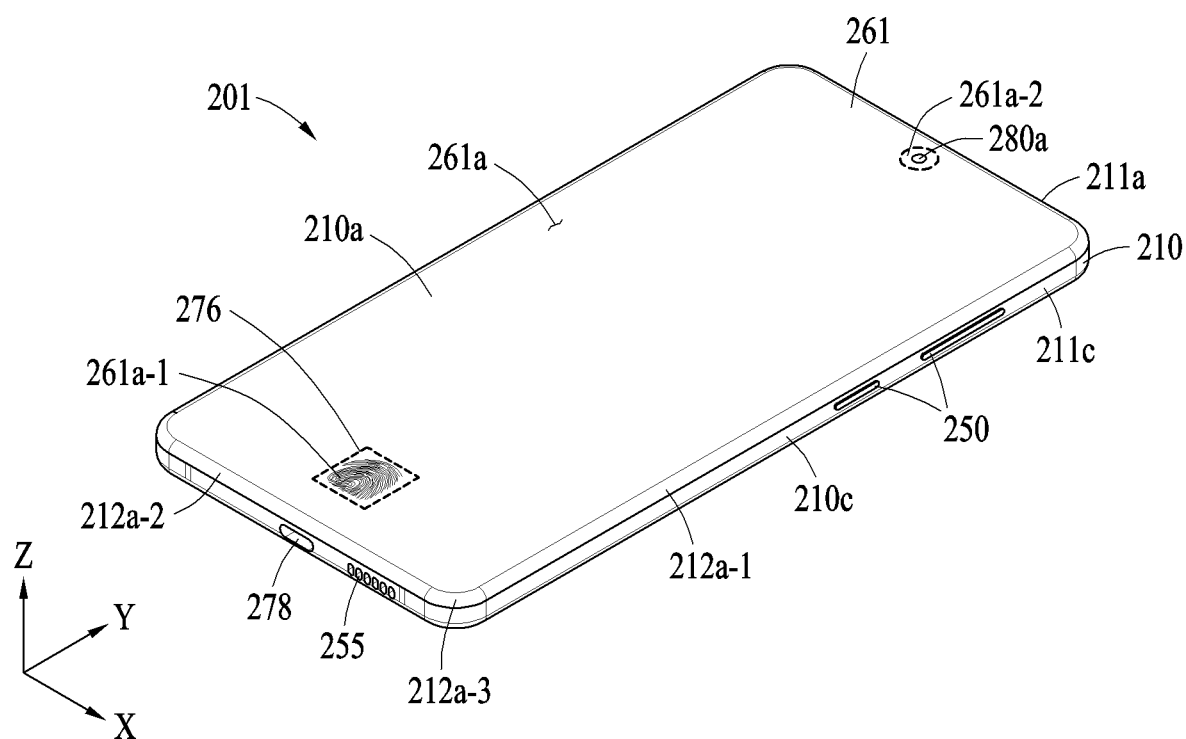
FIG. 2A is a front perspective view of an electronic device according to various embodiments.
Figure 2B:
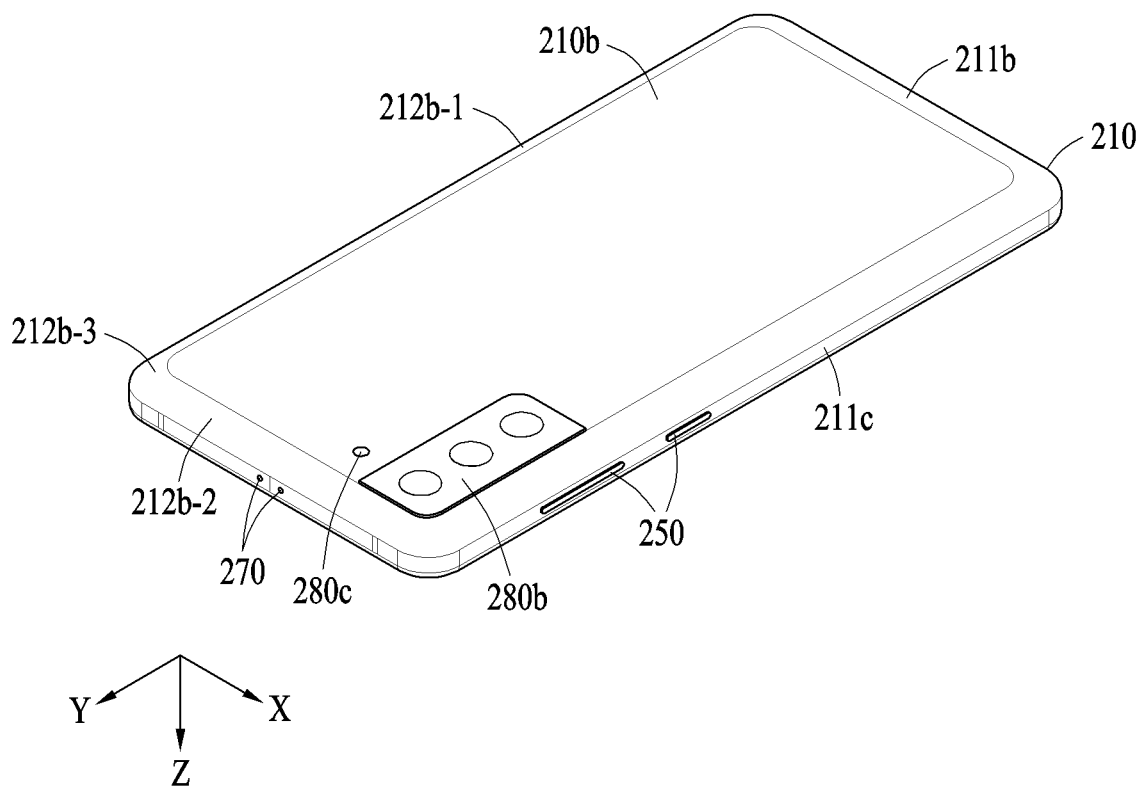
FIG. 2B is a rear perspective view of an electronic device according to various embodiments.
Figure 2C:
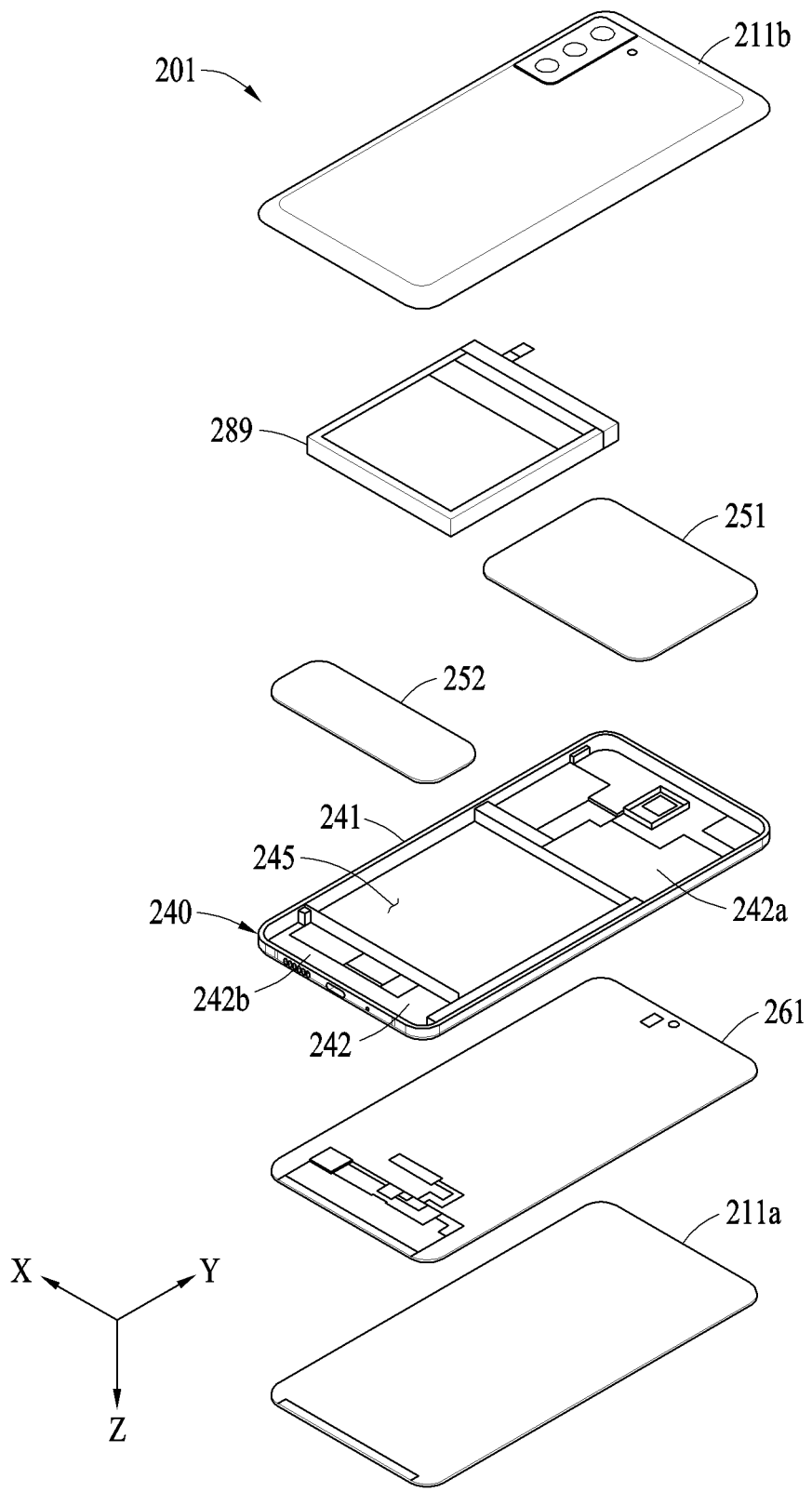
FIG. 2C is an exploded perspective view of an electronic device according to various embodiments.

Referring to FIGS. 2A, 2B and 2C, an electronic device 201 (e.g., the electronic device 101) may include a housing 210 including a first surface 210*a* (e.g., a front surface), a second surface 210*b* (e.g., a rear surface), and a third surface 210*c* (e.g., a side surface) enclosing a space between the first surface 210*a* and the second surface 210*b*.

In an example embodiment, the first surface 210*a* may be formed by a first plate 211*a* of which at least a portion is substantially transparent. For example, the first plate 211*a* may include a polymer plate or a glass plate including at least one coating layer. The second surface 210*b* may be formed by a second plate 211*b* that is substantially opaque. For example, the second plate 211*b* may be formed of coated or tinted glass, ceramic, polymer, metal (e.g., aluminum, stainless steel (STS), or magnesium), or a combination thereof. The third surface 210*c* may be formed by a frame 211*c* that is coupled to the first plate 211*a* and the second plate 211*b* and includes a metal and/or a polymer. In an example embodiment, the second plate 211*b* and the frame 211*c* may be integrally and seamlessly formed. In an example embodiment, the second plate 211*b* and the frame 211*c* may be formed of substantially the same material (e.g., aluminum).

In an example embodiment, the first plate 211*a* may include a plurality of first periphery areas 212*a*-1 that are rounded in a direction from at least one area of the first surface 210*a* toward the second plate 211*b* and extend in one direction (e.g., a +/−Y direction), a plurality of second periphery areas 212*a*-2 that are rounded in the direction from at least one area of the first surface 210*a* toward the second plate 211*b* and extend in the other direction (e.g., a +/−X direction), and a plurality of third periphery areas 212*a*-3 that are rounded in the direction from at least one area of the first surface 210*a* toward the second plate 211*b* and positioned between the plurality of first periphery areas 212*a*-1 and the plurality of second periphery areas 212*a*-2. In an example embodiment, the second plate 211*b* may include a plurality of fourth periphery areas 212*b*-1 that are rounded in a direction from at least one area of the second surface 210*b* toward the first plate 211*a* and extend in one direction (e.g., the +/−Y direction), a plurality of fifth periphery areas 212*b*-2 that are rounded in the direction from at least one area of the second surface 210*b* toward the first plate 211*a* and extend in the other direction (e.g., the +/−X direction), and a plurality of sixth periphery areas 212*b*-3 that are rounded in the direction from at least one area of the second surface 210*b* toward the first plate 211*a* and positioned between the plurality of fourth periphery areas 212*b*-1 and the plurality of fifth periphery areas 212*b*-2.

The electronic device 201 may include a display 261 (e.g., the display module 160). In an example embodiment, the display 261 may be positioned on the first surface 210*a*. In an example embodiment, the display 261 may be visible through at least a portion (e.g., the plurality of first periphery areas 212*a*-1, the plurality of second periphery areas 212*a*-2, and the plurality of third periphery areas 212*a*-3) of the first plate 211*a*. In an example embodiment, the display 261 may have a shape that is substantially the same as or similar to the shape of an outer edge of the first plate 211*a*. In various example embodiments, the periphery of the display 261 may substantially coincide with the outer edge of the first plate 211*a*. In an example embodiment, the display 261 may include a touch sensing circuit, a pressure sensor for measuring an intensity (pressure) of a touch, and/or a digitizer for detecting a magnetic-type stylus pen. In an example embodiment, the display 261 may include a screen display area 261*a* that is visually exposed (e.g., visible) to display content through pixels or voxels. In an example embodiment, the screen display area 261*a* may include a sensing area 261*a*-1 and/or a camera area 261*a*-2. The sensing area 261*a*-1 may overlap at least one area of the screen display area 261*a*. The sensing area 261*a*-1 may allow transmission of an input signal related to a sensor module 276 (e.g., the sensor module 176). The sensing area 261*a*-1 may display content, like the screen display area 261*a* that does not overlap the sensing area 261*a*-1. For example, the sensing area 261*a*-1 may display the content while the sensor module 276 is not operating. The camera area 261*a*-2 may overlap at least one area of the screen display area 261*a*. The camera area 261*a*-2 may allow transmission of an optical signal related to a first camera module 280*a* (e.g., the camera module 180). The camera area 261*a*-2 may display content, like the screen display area 261*a* that does not overlap the camera area 261*a*-2. For example, the camera area 261*a*-2 may display the content while the first camera module 280*a* is not operating.

The electronic device 201 may include an audio module 270 (e.g., the audio module 170). In an example embodiment, the haptic module 270 may be positioned on the third surface 210*c*. In an example embodiment, the audio module 270 may obtain a sound through at least one hole.

The electronic device 201 may include the sensor module 276. In an example embodiment, the sensor module 276 may be positioned on the first surface 210*a*. The sensor module 276 may form the sensing area 261*a*-1 in at least a portion of the screen display area 261*a*. The sensor module 276 may receive an input signal transmitted through the sensing area 261*a*-1 and generate an electrical signal based on the received input signal. As an example, the input signal may have a designated physical quantity (e.g., heat, light, temperature, sound, pressure, or ultrasound). As another example, the input signal may include a signal related to biometric information (e.g., a fingerprint) of a user.

The electronic device 201 may include the first camera module 280*a*, a second camera module 280*b* (e.g., the camera module 180), and a flash 280*c*. In an example embodiment, the first camera module 280*a* may be positioned on the first surface 210*a*, and the second camera module 280*b* and the flash 280*c* may be positioned on the second surface 210*b*. In an example embodiment, at least a portion of the first camera module 280*a* may be positioned under the display 261. In an example embodiment, the first camera module 280*a* may receive an optical signal transmitted through the camera area 261*a*-2. In an example embodiment, the second camera module 280*b* may include a plurality of camera modules (e.g., a dual camera, a triple camera, or a quad camera). In an example embodiment, the flash 280*c* may include a light-emitting diode or a xenon lamp.

The electronic device 201 may include a sound output module 255 (e.g., the sound output module 155). In an example embodiment, the sound output module 255 may be positioned on the third surface 210*c*. In an example embodiment, the sound output module 255 may include one or more holes.

The electronic device 201 may include an input module 250 (e.g., the input module 150). In an example embodiment, the input module 250 may be positioned on the third surface 210*c*. In an example embodiment, the input module 250 may include at least one key input device.

The electronic device 201 may include a connecting terminal 278 (e.g., the connecting terminal 178). In an example embodiment, the connecting terminal 278 may be positioned on the third surface 210*c*. For example, when the electronic device 201 is viewed in one direction (e.g., the +Y direction), the connecting terminal 278 may be positioned at a central portion of the third surface 210*c*, and the sound output module 255 may be positioned on one side (e.g., a right side) with respect to the connecting terminal 278.

The electronic device 201 may include a support body 240, a first circuit board 251, a second circuit board 252, and a battery 289 (e.g., the battery 189). At least a portion of the support body 240 may form the housing 210 together with the first plate 211*a* and the second plate 211*b*. In an example embodiment, the support body 240 may include a frame structure 241 (e.g., the frame 211*c*) and a plate structure 242. The frame structure 241 may be formed to surround a periphery of the plate structure 242. The frame structure 241 may connect a periphery of the first plate 211*a* and a periphery of the second plate 211*b*, surround the space between the first plate 211*a* and the second plate 211*b*, and form the third surface 210*c* of the electronic device 201. The plate structure 242 may include a first portion 242*a* for accommodating the first circuit board 251 and a second portion 242*b* for accommodating the second circuit board 252. The display 261 may be positioned on one surface (e.g., a bottom surface) of the plate structure 242, and the first circuit board 251 and the second circuit board 252 may be positioned on the other surface (e.g., a top surface) of the plate structure 242. In an example embodiment, the plate structure 242 may include an opening 245 positioned between the first portion 242*a* and the second portion 242*b* and passing through both surfaces of the plate structure 242. The opening 245 may accommodate the battery 289.

Figure 3A:
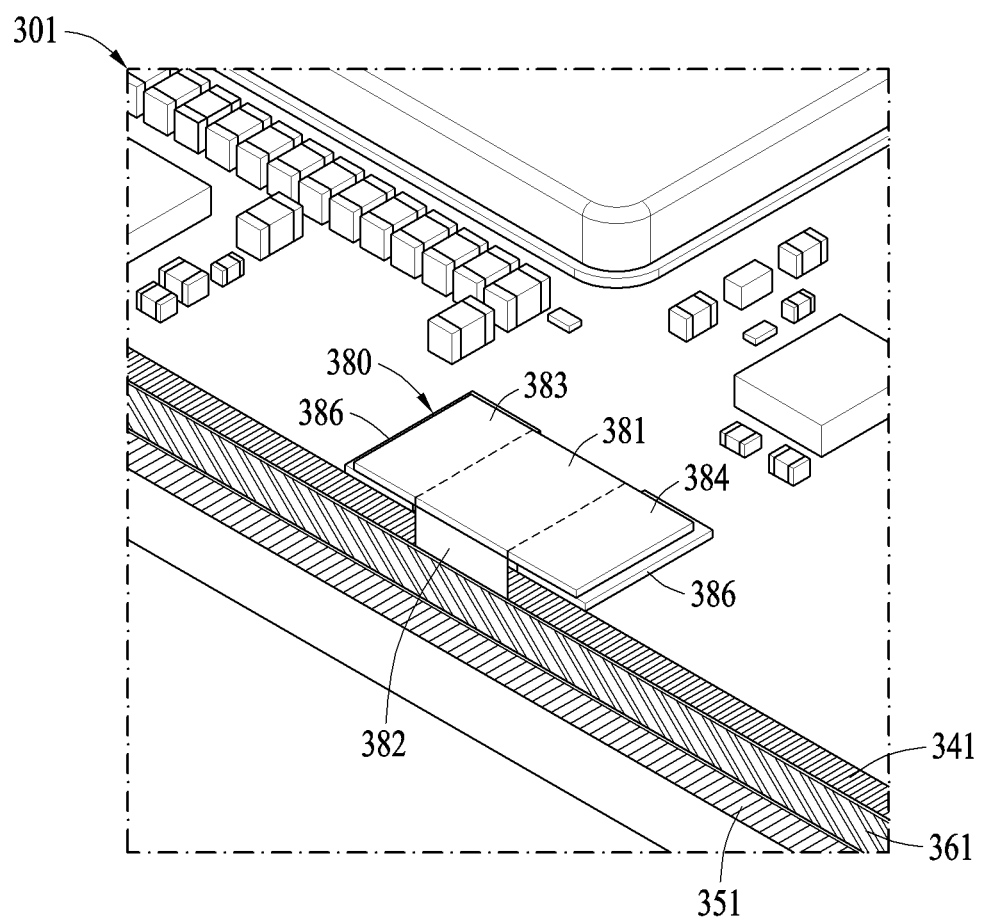
FIG. 3A is a partial perspective view illustrating a portion of stacked printed circuit boards (PCBs) according to various embodiments.
Figure 3B:
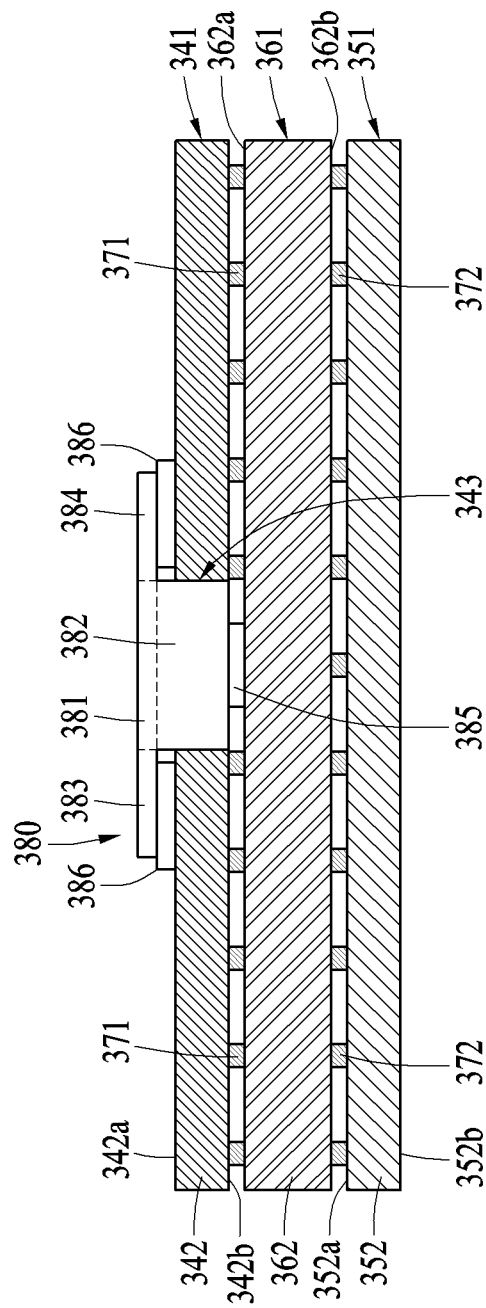
FIG. 3B is a cross-sectional view of stacked PCBs according to various embodiments.
Figure 3C:
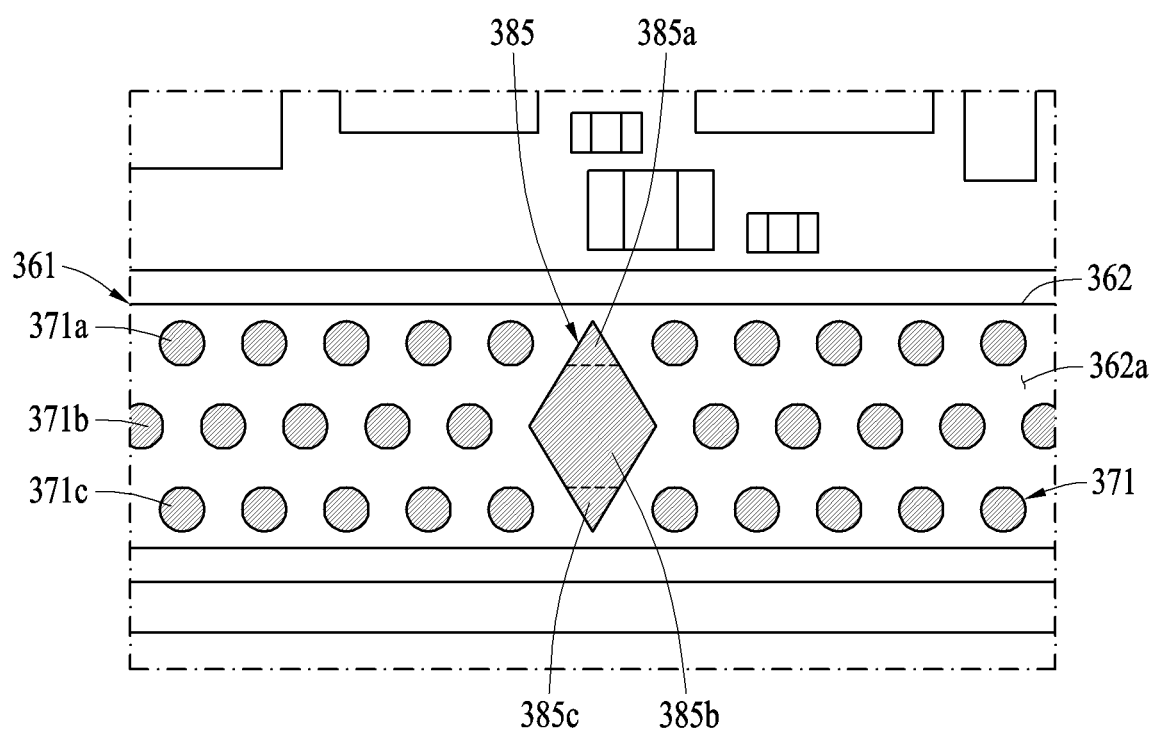
FIG. 3C is a diagram illustrating an example interposer according to various embodiments.

Referring to FIGS. 3A, 3B and 3C, an electronic device 301 (e.g., the electronic device 201) may include a first PCB 341, a second PCB 351, and an interposer 361 between the first PCB 341 and the second PCB 351. The first PCB 341, the second PCB 351, and the interposer 361 may form a single circuit board (e.g., the first circuit board 251 and/or the second circuit board 252). The first PCB 341, the interposer 361, and the second PCB 351 may be stacked in one direction. In an example embodiment, the first PCB 341 may include a first plate 342 having a first surface 342*a* (e.g., a top surface) and a second surface 342*b* (e.g., a bottom surface) opposite the first surface 342*a*. The second PCB 351 may include a second plate 352 having a third surface 352*a* (e.g., a top surface) and a fourth surface 352*b* (e.g., a bottom surface) opposite the third surface 352*a*. The interposer 361 may include a third plate 362 having a fifth surface 362*a* (e.g., a top surface) facing the second surface 342*b* and a sixth surface 362*b* (e.g., a bottom surface) facing the third surface 352*a* and opposite the fifth surface 362*a*.

The electronic device 301 may include a plurality of first vias 371 connecting the first PCB 341 and the interposer 361, and a plurality of second vias 372 connecting the second PCB 351 and the interposer 361. The plurality of first vias 371 may be arranged between the second surface 342b and the fifth surface 362a along the second surface 342b and the fifth surface 362a. The plurality of second vias 372 may be arranged between the third surface 352a and the sixth surface 362b along the third surface 352a and the sixth surface 362b. At least a portion of the plurality of first vias 371 may be signal vias, and the other portion may be ground vias. At least a portion of the plurality of second vias 372 may be signal vias, and the other portion may be ground vias. In an example embodiment, the plurality of first vias 371 and the plurality of second vias 372 may substantially have a ball shape.

In an example embodiment, the plurality of first vias 371 may be arranged in a plurality of rows on the third plate 362. For example, the plurality of first vias 371 may include, on the fifth surface 362a of the third plate 362, a plurality of first vias 371a in a first row, a plurality of first vias 371b in a second row, and a plurality of first vias 371c in a third row. In an example embodiment, the plurality of first vias 371a in the first row and/or the plurality of first vias 371c in the third row may not substantially overlap the plurality of first vias 371b in the second row, when viewed in a direction intersecting with the arrangement direction. In an example embodiment, the plurality of first vias 371a in the first row and the plurality of first vias 371c in the third row may substantially overlap each other, when viewed in the direction intersecting with the arrangement direction. In an example embodiment not shown, the plurality of second vias 372 may also be arranged in substantially the same arrangement formations as the various arrangement formations of the plurality of first vias 371 described above.

In an example embodiment, the first PCB 341 may include a hole 343 formed in the first plate 342. For example, the hole 343 may be positioned at a portion structurally having weak stiffness due to an external impact, of the positions of the plurality of first vias 371. If a first via 371 is positioned at the portion, the first via 371 may be cracked when an external impact is applied to the electronic device 301.

In an example embodiment, the hole 343 may be formed by cutting the first plate 342. The hole 343 may be formed substantially in various shapes such as a circular shape and/or a polygonal shape, but is not limited thereto, and may have, for example, a notch shape formed on the periphery of the first plate 342.

The electronic device 301 may include a reinforcement portion 380 for bonding the first PCB 341 and the interposer 361. The reinforcement portion 380 may be positioned at the portion structurally having weak stiffness to disperse the stress caused by an external impact when the external impact is applied to the electronic device 301. In an example embodiment, the reinforcement portion 380 may be positioned in the hole 343.

In an example embodiment, the reinforcement portion 380 may include a base 381 and a pillar 382. The base 381 may be positioned above the hole 343. The pillar 382 may extend from the base 381 in one direction (e.g., a downward direction) and be coupled to the hole 343. In an example embodiment, the pillar 382 may be positioned substantially in the hole 343. In various example embodiments, at least a portion of the pillar 382 may pass through the hole 343 beyond the second surface 342b. In various example embodiments not shown, at least a portion of the pillar 382 may be bonded to the fifth surface 362a substantially in surface contact. For example, a bonding portion of a conductive material may be formed at an end portion of the pillar 382 facing the fifth surface 362a, and the end portion of the pillar 382 and the fifth surface 362a may be directly bonded through the bonding portion.

In an example embodiment, the pillar 382 may have a substantially circular cross-section or polygonal cross-section. In an example embodiment, the pillar 382 and the hole 343 may have cross-sections corresponding to each other.

In an example embodiment, the pillar 382 may be coupled by fit to the hole 343. In an example embodiment in which the pillar 382 has a substantially circular cross-section, a diameter of the pillar 382 may be substantially equal to or less than a diameter of the hole 343. In an example embodiment in which the pillar 382 has a polygonal cross-section, a width of the pillar 382 may be substantially equal to or less than a width of the hole 343. The width of the pillar 382 may indicate a maximum length in the polygonal cross-section of the pillar 382, and the width of the hole 343 may be a maximum length in the cross-section of the hole 343.

In an example embodiment, the reinforcement portion 380 may include a first flange 383 and a second flange 384. The first flange 383 may be connected to a first side (e.g., a left side) of the base 381 and positioned on the first surface 342a. The second flange 384 may be connected to a second side (e.g., a right side) of the base 381 and positioned on the first surface 342a. The first flange 383 and the second flange 384 may reinforce both portions of the first plate 342 with respect to the hole 343. In various example embodiments, the first flange 383 and the second flange 384 may be bonded to the first surface 342a substantially in surface contact. For example, bonding portions of a conductive material may be formed respectively on one surface (e.g., a bottom surface) of the first flange 383 and one surface (e.g., a bottom surface) of the second flange 384, the surfaces facing the first surface 342a, and the first flange 383 and the second flange 384 may be bonded directly to the first surface 342a through the bonding portions. In another example embodiment, the reinforcement portion 380 may include only one of the first flange 383 and the second flange 384.

In an example embodiment, the base 381, the pillar 382, the first flange 383, and the second flange 384 may be integrally and seamlessly formed.

In an example embodiment, the base 381, the pillar 382, the first flange 383, and the second flange 384 may be formed of a predetermined material suitable for reinforcing a portion structurally having weak stiffness. For example, the material may be stainless steel (e.g., SUS).

In an example embodiment, the reinforcement portion 380 may include a first pad 385 and a pair of second pads 386. The first pad 385 may be positioned between the pillar 382 and the third plate 362 to bond one surface (e.g., a lower end surface) of the pillar 382 and the fifth surface 362a. One second pad 386 of the pair of second pads 386 may be positioned between the first flange 383 and the first plate 342 to bond one surface (e.g., a bottom surface) of the first flange 383 and the first surface 342a. The other second pad 386 of the pair of second pads 386 may be positioned between the second flange 384 and the first plate 342 to bond one surface (e.g., a bottom surface) of the second flange 384 and the first surface 342a. In an example embodiment, the first pad 385 may have an area smaller than an area of one surface (e.g., the end surface) of the pillar 382. In an example embodiment, at least a portion of one second pad 386 of the pair of second pads 386 may be formed to expand beyond one surface (e.g., a side surface) of the first flange 383, and at least a portion of the other second pad 386 of the pair of second pads 386 may be formed to expand beyond one surface (e.g., a side surface) of the second flange 384. In an example embodiment, the first pad 385 and the pair of second pads 386 may be formed of a conductive material.

In an example embodiment, the first pad 385 may have various areas applicable to the fifth surface 362a of the third plate 362 of the interposer 361. For example, the first pad 385 may have a first area 385a between a pair of adjacent first vias 371a in a first row, a second area 385b between a pair of adjacent first vias 371b in a second row, and a third area 385c between a pair of adjacent first vias 371c in a third row. In an example embodiment, the first area 385a and the third area 385c may have substantially the same area. In an example embodiment, the first area 385a and/or the third area 385c may have an area different from that of the second area 385b. In an example embodiment, the first area 385a may have a size corresponding to a size of one first via 371a in the first row. In an example embodiment, the second area 385b may have a size corresponding to a size of two first vias 371b in the second row. In an example embodiment, the third area 385c may have a size corresponding to a size of one first via 371c in the third row. In an example embodiment, the first area 385a, the second area 385b, and/or the third area 385c may be substantially equidistantly apart from a pair of adjacent first vias 371a, 371b, 371c. In an example embodiment, the first pad 385 may be positioned in an area in which a portion (e.g., four) of the first vias 371 are deleted. In various example embodiments, the first pad 385 may be positioned in a portion (e.g., a ground area) in which the first vias 371 are not positioned, without deletion of the first vias 371. Meanwhile, the shape and/or area of the first pad 385 is not limited thereto, and a required shape and/or area may vary in accordance with the stiffness of the plurality of first vias 371.

Figure 4:
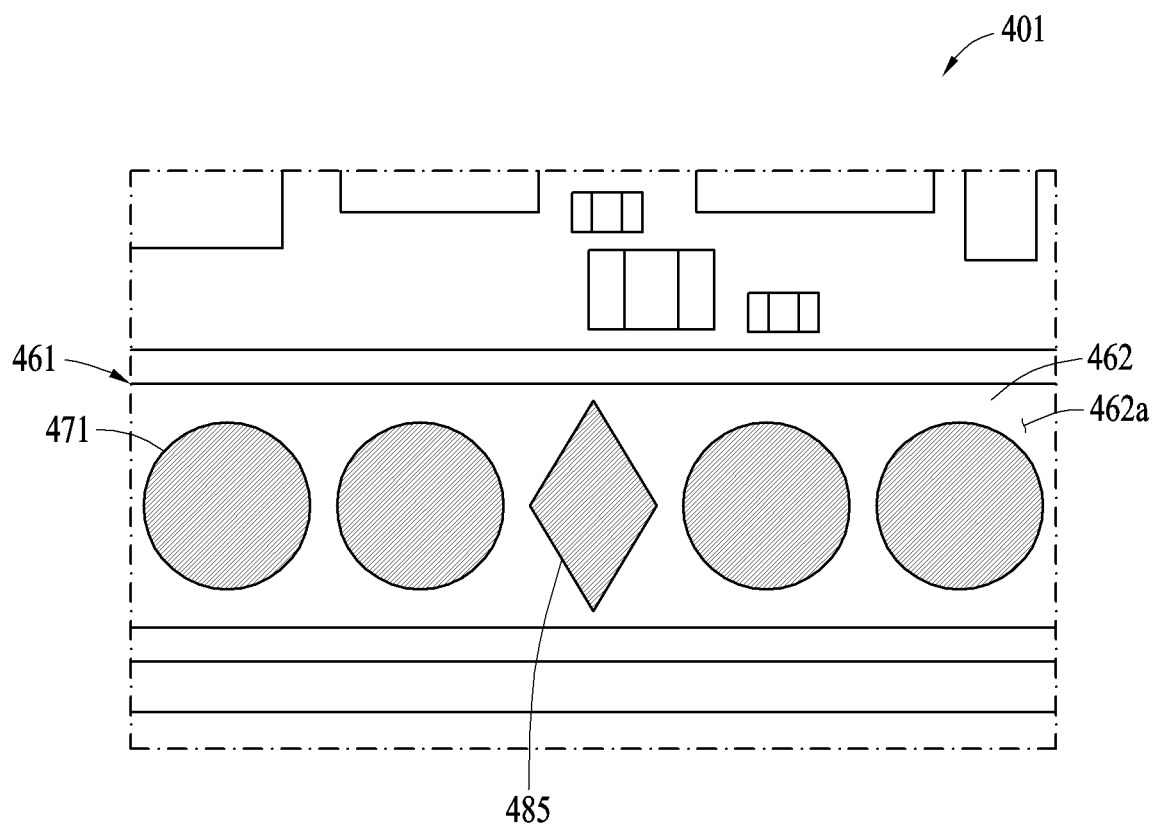
FIG. 4 is a diagram illustrating an example interposer according to various embodiments.

Referring to FIG. 4, an electronic device 401 (e.g., the electronic device 301) may include an interposer 461 (e.g., the interposer 361), and the interposer 461 may include a plate 462 (e.g., the third plate 362) having one surface 462a (e.g., the fifth surface 362a) and a plurality of vias 471 (e.g., the first vias 371). The plurality of vias 471 may be arranged in a single row on the one surface 462a of the plate 462. A pad 485 (e.g., the first pad 385) may be positioned between a pair of adjacent vias 471.

Figure 5:
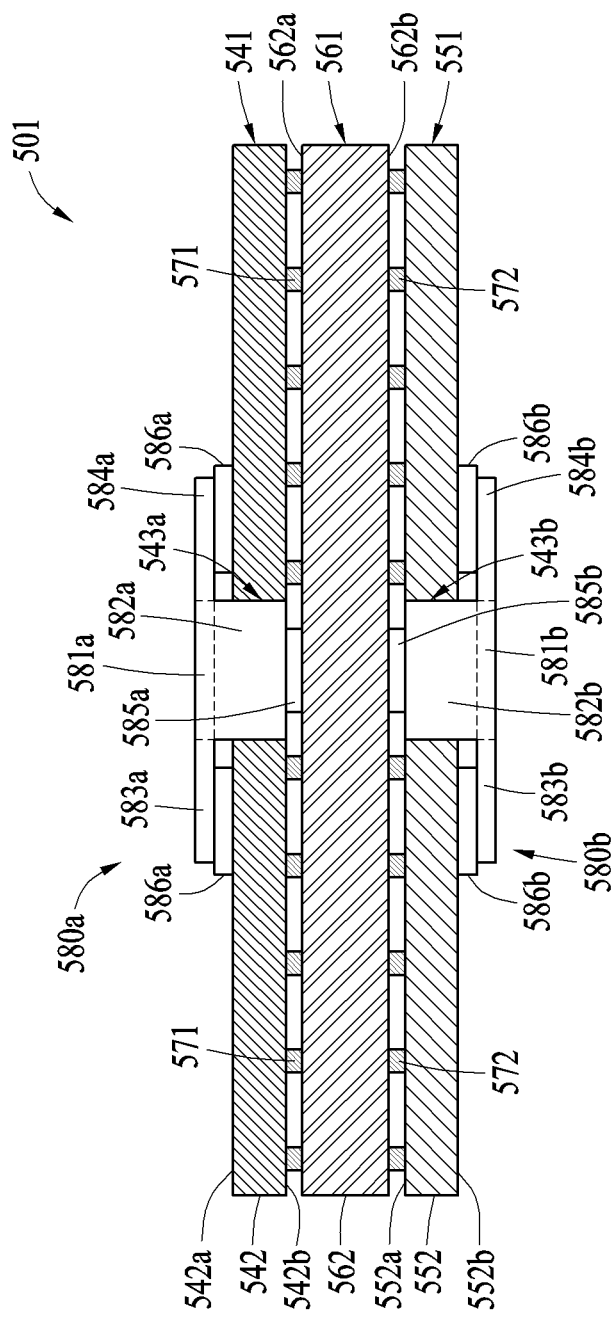
FIG. 5 is a cross-sectional view of stacked PCBs according to various embodiments.

Referring to FIG. 5, an electronic device 501 (e.g., the electronic device 301) may include a first PCB 541 (e.g., the first PCB 341), a second PCB 551 (e.g., the second PCB 351), an interposer 561 (e.g., the interposer 361), a plurality of first vias 571 (e.g., the first vias 371), and a plurality of second vias 572 (e.g., the second vias 372). The first PCB 541 may include a first plate 542 (e.g., the first plate 342) having a first surface 542a (e.g., the first surface 342a) and a second surface 542b (e.g., the second surface 342b), and a first hole 543a (e.g., the hole 343). The second PCB 551 may include a second plate 552 (e.g., the second plate 352) having a third surface 552a (e.g., the third surface 352a) and a fourth surface 552b (e.g., the fourth surface 352b), and a second hole 543b formed in the second plate 552. The interposer 561 may include a third plate 562 (e.g., the third plate 362) having a fifth surface 562a (e.g., the fifth surface 362a) and a sixth surface 562b (e.g., the sixth surface 362b).

In an example embodiment, the second hole 543b may be positioned at a portion structurally having weak stiffness due to an external impact, of the positions of the plurality of second vias 572. In an example embodiment, a second via 572 may not be formed at a position between the third surface 552a and the sixth surface 562b and corresponding to the position of the second hole 543b. In an example embodiment, the position of the second hole 543b may be substantially the same as or similar to the position of the first hole 543a. In an example embodiment, the first hole 543a and the second hole 543b may be formed substantially symmetrically with respect to the third plate 562. In an example embodiment, the second hole 543b may be formed by cutting the second plate 552. The second hole 543b may be formed substantially in various shapes such as a circular shape and/or a polygonal shape, but is not limited thereto, and may have, for example, a notch shape formed on the periphery of the second plate 552.

In an example embodiment, the electronic device 501 may include a first reinforcement portion 580a (e.g., the reinforcement portion 380) for bonding the first PCB 541 and the interposer 561, and a second reinforcement portion 580b for bonding the second PCB 551 and the interposer 561. The first reinforcement portion 580a and the second reinforcement portion 580b may be positioned at portions structurally having weak stiffness to disperse the stress caused by an external impact when the external impact is applied to the electronic device 501. In an example embodiment, the first reinforcement portion 580a may be positioned in the first hole 543a, and the second reinforcement portion 580b may be positioned in the second hole 543b.

In an example embodiment, the first reinforcement portion 580a may include a first base 581a (e.g., the base 381) and a first pillar 582a (e.g., the pillar 382). In an example embodiment, the first reinforcement portion 580a may include a first flange 583a (e.g., the first flange 383) and a second flange 584a (e.g., the second flange 384). In an example embodiment, the first reinforcement portion 580a may include a first pad 585a (e.g., the first pad 385) and a pair of second pads 586a (e.g., the second pads 386).

In an example embodiment, the second reinforcement portion 580b may include a second base 581b and a second pillar 582b. The second base 581b may be positioned above the second hole 543b. The second pillar 582b may extend from the second base 581b in one direction (e.g., the upward direction in FIG. 5) and be coupled to the second hole 543b. In an example embodiment, the second pillar 582b may be positioned substantially in the second hole 543b. In various example embodiments, at least a portion of the second pillar 582b may pass through the second hole 543b beyond the third surface 552a. In various example embodiments not shown, at least a portion of the second pillar 582b may be bonded to the sixth surface 562b substantially in surface contact. For example, a bonding portion of a conductive material may be formed at an end portion of the second pillar 582b facing the sixth surface 562b, and the end portion of the second pillar 582b and the sixth surface 562b may be bonded through the bonding portion.

In an example embodiment, the second pillar 582b may have a substantially circular cross-section or polygonal cross-section. In an example embodiment, the second pillar 582b and the second hole 543b may have cross-sections corresponding to each other.

In an example embodiment, the second pillar 582b may be coupled by fit to the second hole 543b. In an example embodiment in which the second pillar 582b has a substantially circular cross-section, a diameter of the second pillar 582b may be substantially equal to or less than a diameter of the second hole 543b. In an example embodiment in which the second pillar 582b has a polygonal cross-section, a width of the second pillar 582b may be substantially equal to or less than a width of the second hole 543b. Here, the width of the second pillar 582b may indicate a maximum length in the polygonal cross-section of the second pillar 582*b*, and the width of the second hole 543*b* may be a maximum length in the cross-section of the second hole 543*b*.

In an example embodiment, the second reinforcement portion 580*b* may include a third flange 583*b* and a fourth flange 584*b*. The third flange 583*b* may be connected to a first side (e.g., the left side in FIG. 5) of the second base 581*b* and positioned on the fourth surface 552*b*. The fourth flange 584*b* may be connected to a second side (e.g., the right side in FIG. 5) of the second base 581*b* and positioned on the fourth surface 552*b*. The third flange 583*b* and the fourth flange 584*b* may reinforce both portions of the second plate 552 with respect to the second hole 543*b*. In various example embodiments, the third flange 583*b* and the fourth flange 584*b* may be bonded to the fourth surface 552*b* substantially in surface contact. For example, bonding portions of a conductive material may be formed respectively on one surface (e.g., a top surface) of the third flange 583*b* and one surface (e.g., a top surface) of the fourth flange 584*b*, the surfaces facing the fourth surface 552*b*, and the third flange 583*b* and the fourth flange 584*b* may be bonded to the fourth surface 552*b* through the bonding portions. In another example embodiment, the second reinforcement portion 580*b* may include only one of the third flange 583*b* and the fourth flange 584*b*.

In an example embodiment, the second base 581*b*, the second pillar 582*b*, the third flange 583*b*, and the fourth flange 584*b* may be integrally and seamlessly formed.

In an example embodiment, the second base 581*b*, the second pillar 582*b*, the third flange 583*b*, and the fourth flange 584*b* may be formed of a predetermined material suitable for reinforcing a portion structurally having weak stiffness. For example, the material may be stainless steel (e.g., SUS).

In an example embodiment, the second reinforcement portion 580*b* may include a third pad 585*b* and a pair of fourth pads 586*b*. The third pad 585*b* may be positioned between the second pillar 582*b* and the third plate 562 to bond one surface (e.g., the upper end surface in FIG. 5) of the second pillar 582*b* and the sixth surface 562*b*. One fourth pad 586*b* of the pair of fourth pads 586*b* may be positioned between the third flange 583*b* and the second plate 552 to bond one surface (e.g., a top surface) of the third flange 583*b* and the fourth surface 552*b*. The other fourth pad 586*b* of the pair of fourth pads 586*b* may be positioned between the fourth flange 584*b* and the second plate 552 to bond one surface (e.g., the top surface in FIG. 5) of the fourth flange 584*b* and the fourth surface 552*b*. In an example embodiment, the third pad 585*b* may have an area smaller than an area of one surface (e.g., the end surface) of the second pillar 582*b*. In an example embodiment, at least a portion of one fourth pad 586*b* of the pair of fourth pads 586*b* may be formed to expand beyond one surface (e.g., a side surface) of the third flange 583*b*, and at least a portion of the other fourth pad 586*b* of the pair of fourth pads 586*b* may be formed to expand beyond one surface (e.g., a side surface) of the fourth flange 584*b*. In an example embodiment, the third pad 585*b* and the pair of fourth pads 586*b* may be formed of a conductive material.

In an example embodiment, the third pad 585*b* may have various areas applicable to the sixth surface 562*b* of the third plate 562 of the interposer 561. For example, the plurality of second vias 572 and the third pad 585 may have substantially the same shapes as the plurality of first vias 371 and the first pad 385 arranged on the third plate 362 shown in FIG. 3C. Meanwhile, the shape and/or area of the third pad 585 is not limited thereto, and a required shape and/or area may vary in accordance with the stiffness of the plurality of second vias 572.

Figure 6A:
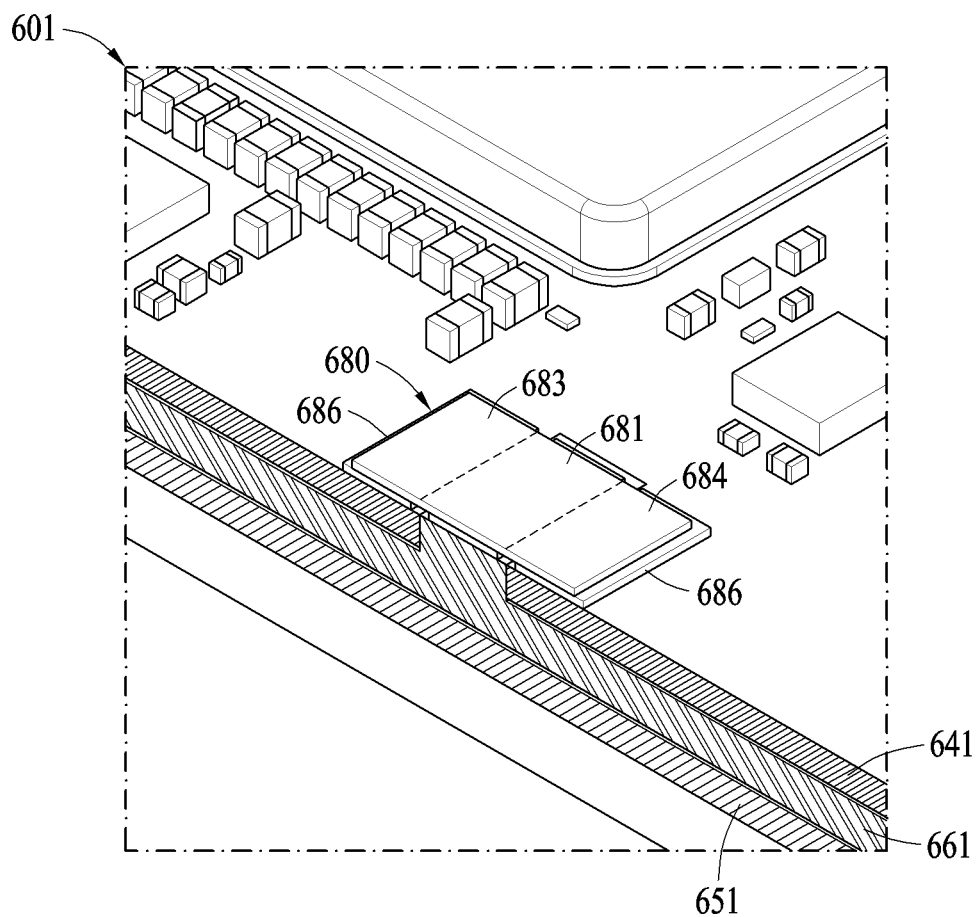
FIG. 6A is a partial perspective view illustrating a portion of stacked PCBs according to various embodiments.
Figure 6B:
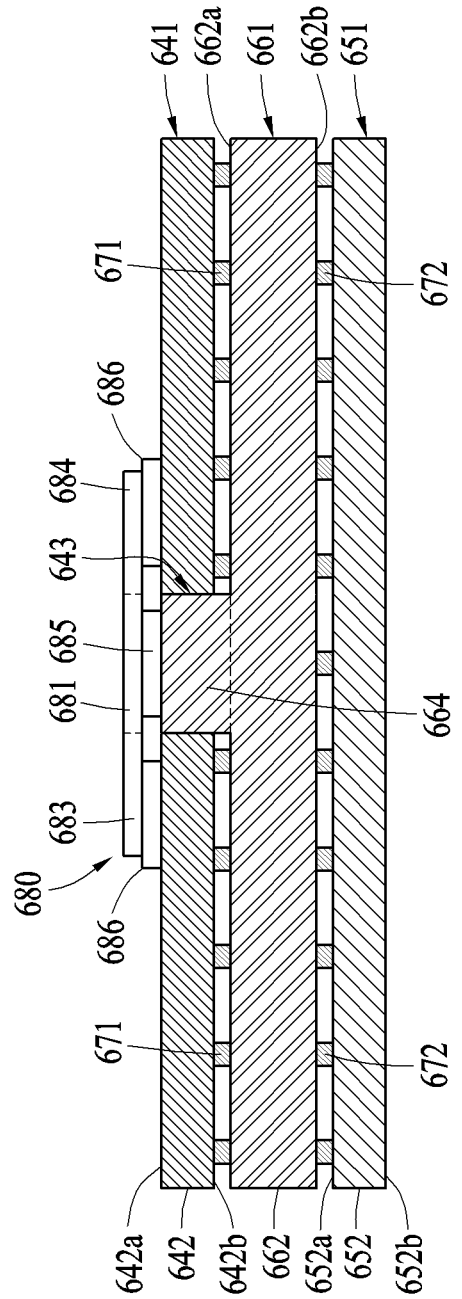
FIG. 6B is a cross-sectional view of stacked PCBs according to an example embodiment.

Referring to FIGS. 6A and 6B, an electronic device 601 (e.g., the electronic device 301) may include a first PCB 641 (e.g., the first PCB 341), a second PCB 651 (e.g., the second PCB 351), an interposer 661 (e.g., the interposer 361), a plurality of first vias 671 (e.g., the first vias 371), a plurality of second vias 672 (e.g., the second vias 372), and a reinforcement portion 680 (e.g., the reinforcement portion 380). The first PCB 641 may include a first plate 642 (e.g., the first plate 342) having a first surface 642*a* (e.g., the first surface 342*a*) and a second surface 642*b* (e.g., the second surface 342*b*), and a hole 643 (e.g., the hole 343). The second PCB 651 may include a second plate 652 (e.g., the second plate 352) having a third surface 652*a* (e.g., the third surface 352*a*) and a fourth surface 652*b* (e.g., the fourth surface 352*b*). The interposer 661 may include a third plate 662 (e.g., the third plate 362) having a fifth surface 662*a* (e.g., the fifth surface 362*a*) and a sixth surface 662*b* (e.g., the sixth surface 362*b*), and a pillar 664 formed on the third plate 662. The reinforcement portion 680 may include a base 681 (e.g., the base 381), a first flange 683 (e.g., the first flange 383), a second flange 684 (e.g., the second flange 384), a first pad 685 (e.g., the first pad 385), and a pair of second pads 686 (e.g., the second pads 386).

In an example embodiment, the pillar 664 may extend from the fifth surface 662*a* of the third plate 662 of the interposer 661 in one direction (e.g., the upward direction in FIG. 6B) and be coupled to the hole 643. In an example embodiment, the pillar 664 may be positioned substantially in the hole 643. In various example embodiments, at least a portion of the pillar 664 may pass through the hole 643 beyond the first surface 642*a* of the first plate 642. In various example embodiments not shown, at least a portion of the pillar 664 may be bonded to the base 681 in surface contact.

In an example embodiment, the pillar 664 may have a substantially circular cross-section or polygonal cross-section. In an example embodiment, the pillar 664 and the hole 643 may have cross-sections corresponding to each other.

In an example embodiment, the pillar 664 may be coupled by fit to the hole 643. In an example embodiment in which the pillar 664 has a substantially circular cross-section, a diameter of the pillar 664 may be substantially equal to or less than a diameter of the hole 643. In an example embodiment in which the pillar 664 has a polygonal cross-section, a width of the pillar 664 may be substantially equal to or less than a width of the hole 643. Here, the width of the pillar 664 may indicate a maximum length in the polygonal cross-section of the pillar 664, and the width of the hole 643 may be a maximum length in the cross-section of the hole 643.

In an example embodiment, the first pad 685 may be positioned on the first plate 642 and between the pillar 664 and the base 681 to bond one surface (e.g., an upper end surface) of the pillar 664 and one surface (e.g., a bottom surface) of the base 681. In an example embodiment, the first pad 685 may have an area smaller than an area of one surface (e.g., the end surface) of the pillar 664.

In another example embodiment, at least a portion (e.g., the top surface) of the pillar 664 and/or at least a portion (e.g., the bottom surface) of the base 681, and/or at least a portion (e.g., the bottom surface) of the first flange 683 and/or at least a portion (e.g., the bottom surface) of the second flange 684 may be formed of bonding portion(s) of a conductive material, and the bonding portion(s) may bond at least a portion of the base 681 to the pillar 664 and/or bond at least a portion of the first flange 683 and/or at least a portion of the second flange 684 to the first surface 642a.

Figure 7:
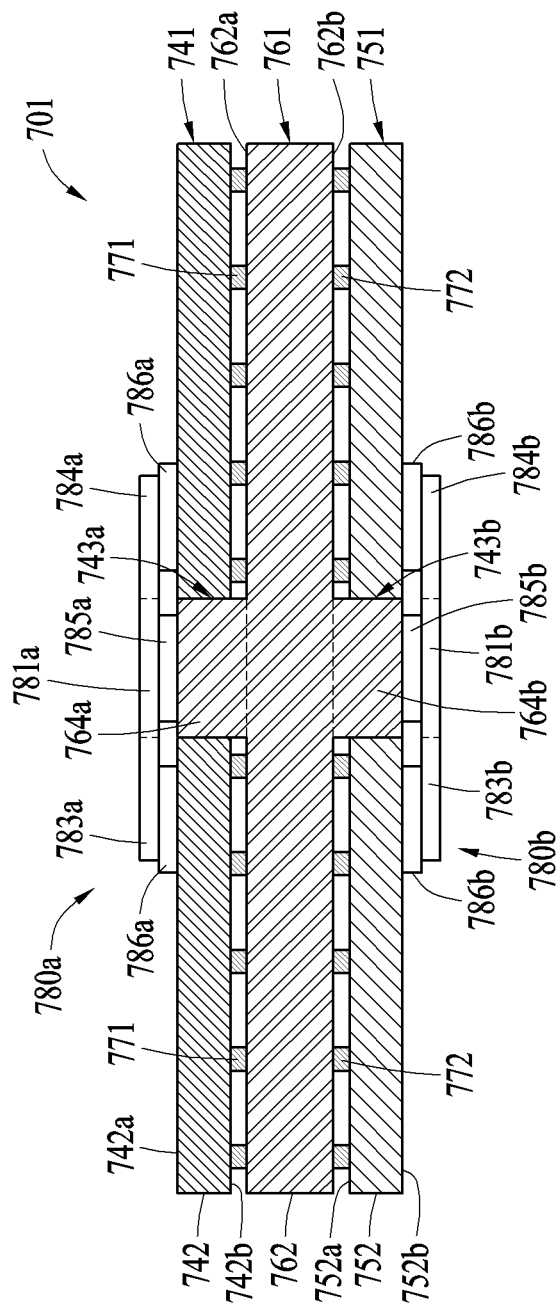
FIG. 7 is a cross-sectional view of stacked PCBs according to various embodiments.

Referring to FIG. 7, an electronic device 701 (e.g., the electronic device 601) may include a first PCB 741 (e.g., the first PCB 641), a second PCB 751 (e.g., the second PCB 651), an interposer 761 (e.g., the interposer 661), a plurality of first vias 771 (e.g., the first vias 671), and a plurality of second vias 772 (e.g., the second vias 672). The first PCB 741 may include a first plate 742 (e.g., the first plate 642) having a first surface 742a (e.g., the first surface 642a) and a second surface 742b (e.g., the second surface 642b), and a first hole 743a (e.g., the hole 643). The second PCB 751 may include a second plate 752 (e.g., the second plate 652) having a third surface 752a (e.g., the third surface 652a) and a fourth surface 752b (e.g., the fourth surface 652b), and a second hole 743b (e.g., the second hole 543b) formed in the second plate 752. The interposer 761 may include a third plate 762 (e.g., the third plate 662) having a fifth surface 762a (e.g., the fifth surface 662a) and a sixth surface 762b (e.g., the sixth surface 662b), a first pillar 764a (e.g., the pillar 664), and a second pillar 764b.

In an example embodiment, the electronic device 701 may include a first reinforcement portion 780a (e.g., the reinforcement portion 680) for bonding the first PCB 741 and the interposer 761, and a second reinforcement portion 780b for bonding the second PCB 751 and the interposer 761. The first reinforcement portion 780a and the second reinforcement portion 780b may be positioned at portions structurally having weak stiffness to disperse the stress caused by an external impact when the external impact is applied to the electronic device 701. In an example embodiment, the first reinforcement portion 780a may be positioned in the first hole 743a, and the second reinforcement portion 780b may be positioned in the second hole 743b.

In an example embodiment, the first reinforcement portion 780a may include a first base 781a (e.g., the base 681). In an example embodiment, the first reinforcement portion 780a may include a first flange 783a (e.g., the first flange 683) and a second flange 784a (e.g., the second flange 684). In an example embodiment, the first reinforcement portion 780a may include a first pad 785a (e.g., the first pad 685) and a pair of second pads 786a (e.g., the second pads 686).

In an example embodiment, the second reinforcement portion 780b may include a second base 781b positioned above the second hole 743b.

In an example embodiment, the second reinforcement portion 780b may include a third flange 783b and a fourth flange 784b. The third flange 783b may be connected to a first side (e.g., the left side in FIG. 7) of the second base 781b and positioned on the fourth surface 752b. The fourth flange 784b may be connected to a second side (e.g., the right side in FIG. 7) of the second base 781b and positioned on the fourth surface 752b. The third flange 783b and the fourth flange 784b may reinforce both portions of the second plate 752 with respect to the second hole 743b. In various example embodiments, the third flange 783b and the fourth flange 784b may be bonded to the fourth surface 752b substantially in surface contact. In another example embodiment, the second reinforcement portion 780b may include only one of the third flange 783b and the fourth flange 784b.

In an example embodiment, the second base 781b, the third flange 783b, and the fourth flange 784b may be integrally and seamlessly formed.

In an example embodiment, the second base 781b, the third flange 783b, and the fourth flange 784b may be formed of a predetermined material suitable for reinforcing a portion structurally having weak stiffness. For example, the material may be stainless steel (e.g., SUS).

In an example embodiment, the second pillar 764b may extend from the sixth surface 762b of the third plate 762 of the interposer 761 in one direction (e.g., the downward direction in FIG. 7) and be coupled to the second hole 743b. In an example embodiment, the second pillar 764b may be positioned substantially in the second hole 743b. In various example embodiments, at least a portion of the second pillar 764b may pass through the second hole 743b beyond the fourth surface 752b of the second plate 752. In various example embodiments not shown, at least a portion of the second pillar 764b may be bonded to the second base 781b in surface contact. For example, a bonding portion of a conductive material may be formed on one surface (e.g., the bottom surface) of the first base 781a and/or one surface (e.g., the top surface) of the first pillar 764a, and the first base 781a and the first pillar 764a may be bonded through the bonding portion.

In an example embodiment, the second pillar 764b may have a substantially circular cross-section or polygonal cross-section. In an example embodiment, the second pillar 764b and the second hole 743b may have cross-sections corresponding to each other.

In an example embodiment, the second pillar 764b may be coupled by fit to the second hole 743b. In an example embodiment in which the second pillar 764b has a substantially circular cross-section, a diameter of the second pillar 764b may be substantially equal to or less than a diameter of the second hole 743b. In an example embodiment in which the second pillar 764b has a polygonal cross-section, a width of the second pillar 764b may be substantially equal to or less than a width of the second hole 743b. Here, the width of the second pillar 764b may indicate a maximum length in the polygonal cross-section of the second pillar 764b, and the width of the second hole 743b may be a maximum length in the cross-section of the second hole 743b.

In an example embodiment, the second reinforcement portion 780b may include a third pad 785b and a pair of fourth pads 786b. The third pad 785b may be positioned between the second pillar 764b and the second base 781b and bond one surface (e.g., the lower end surface in FIG. 7) of the second pillar 764b and one surface (e.g., the top surface in FIG. 7) of the base 781b. One fourth pad 786b of the pair of fourth pads 786b may be positioned between the third flange 783b and the second plate 752 to bond one surface (e.g., the top surface in FIG. 7) of the third flange 783b and the fourth surface 752b. The other fourth pad 786b of the pair of fourth pads 786b may be positioned between the fourth flange 784b and the second plate 752 to bond one surface (e.g., the top surface in FIG. 7) of the fourth flange 784b and the fourth surface 752b. In an example embodiment, the third pad 785b may have an area smaller than an area of one surface (e.g., the lower end surface) of the second pillar 764b and/or one surface (e.g., the top surface) of the second base 781b. In an example embodiment, at least a portion of one fourth pad 786b of the pair of fourth pads 786b may be formed to expand beyond one surface (e.g., a side surface) of the third flange 783b, and at least a portion of the other fourth pad 786b of the pair of fourth pads 786b may be formed to expand beyond one surface (e.g., a side surface) of the fourth flange 784b. In an example embodiment, the third pad 785b and the pair of fourth pads 786b may be formed of a conductive material.

For example, bonding portions of a conductive material may be formed on at least a portion (e.g., a top surface) of the third flange 783b and at least a portion (e.g., a top surface) of the fourth flange 784*b*, and the bonding portions may bond the third flange 783*b* and the fourth flange 784*b* to the fourth surface 752*b*.

Figure 8:
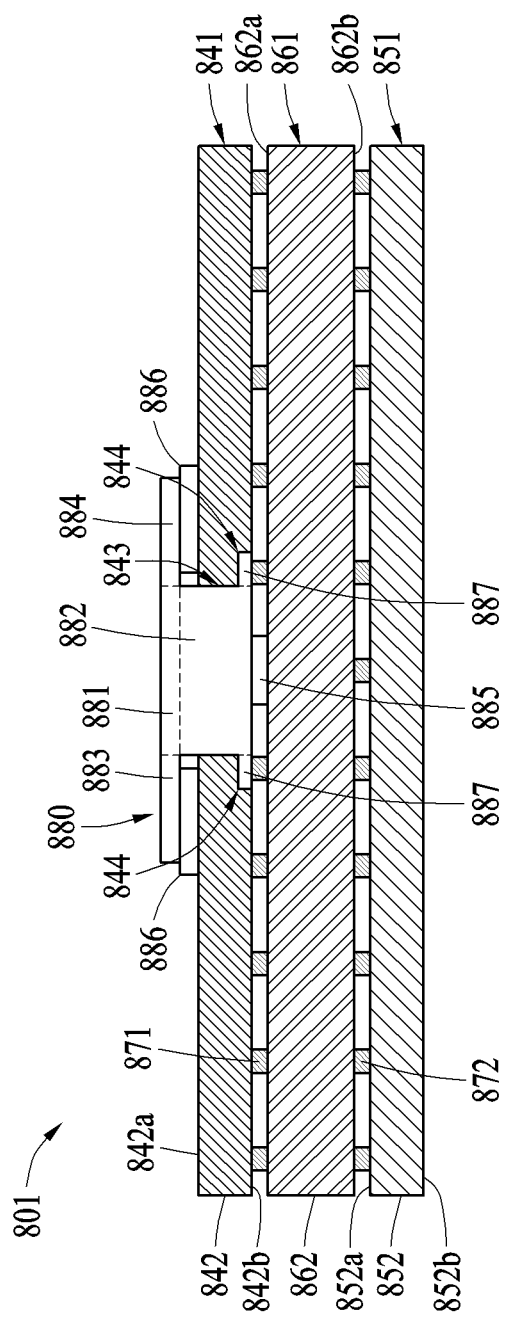
FIG. 8 is a cross-sectional view of stacked PCBs according to various embodiments.

Referring to FIG. 8, an electronic device 801 (e.g., the electronic device 301) may include a first PCB 841 (e.g., the first PCB 341), a second PCB 851 (e.g., the second PCB 351), an interposer 861 (e.g., the interposer 361), a plurality of first vias 871 (e.g., the first vias 371), a plurality of second vias 872 (e.g., the second vias 372), and a reinforcement portion 880 (e.g., the reinforcement portion 380). The first PCB 841 may include a first plate 842 (e.g., the first plate 342) having a first surface 842*a* (e.g., the first surface 342*a*) and a second surface 842*b* (e.g., the second surface 342*b*), and a hole 843 (e.g., the hole 343). The second PCB 851 may include a second plate 852 (e.g., the second plate 352) having a third surface 852*a* (e.g., the third surface 352*a*) and a fourth surface 852*b* (e.g., the fourth surface 352*b*). The interposer 861 may include a third plate 862 (e.g., the third plate 362) having a fifth surface 862*a* (e.g., the fifth surface 362*a*) and a sixth surface 862*b* (e.g., the sixth surface 362*b*). The reinforcement portion 880 may include a base 881 (e.g., the base 381), a pillar 882 (e.g., the pillar 382), a first flange 883 (e.g., the first flange 383), a second flange 884 (e.g., the second flange 384), a first pad 885 (e.g., the first pad 385), and a pair of second pads 886 (e.g., the second pads 386).

In an example embodiment, the reinforcement portion 880 may be at least partially riveted to the first plate 842. For example, the reinforcement portion 880 may include a riveting portion 887 extending from one surface (e.g., a side surface) of the pillar 882. The riveting portion 887 may be riveted to a recess 844 formed in the second surface 842*b* of the first plate 842. In an example embodiment, the riveting portion 887 may be bonded to the fifth surface 862*a* through a first via 871 and/or an additional pad (not shown). In another example embodiment, at least a portion of the riveting portion 887 may be formed of a bonding portion of a conductive material, and the bonding portion may bond the riveting portion 887 and the fifth surface 862*a*. Meanwhile, although not shown, the structure of the reinforcement portion 880 as described above may also be formed on the second PCB 851.

Figure 9:
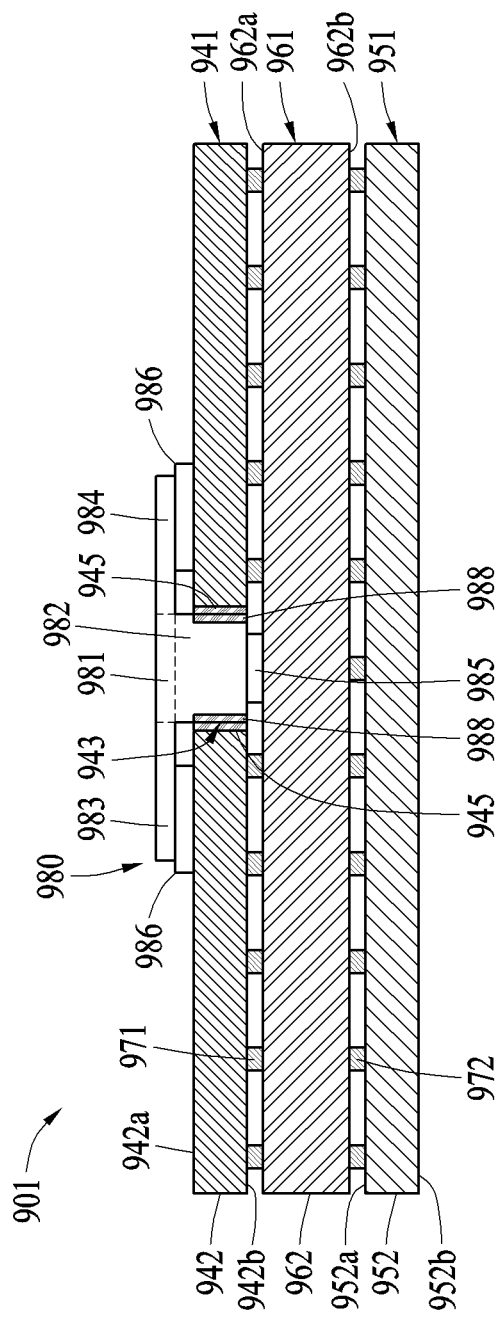
FIG. 9 is a cross-sectional view of stacked PCBs according to various embodiments.

Referring to FIG. 9, an electronic device 901 (e.g., the electronic device 301) may include a first PCB 941 (e.g., the first PCB 341), a second PCB 951 (e.g., the second PCB 351), an interposer 961 (e.g., the interposer 361), a plurality of first vias 971 (e.g., the first vias 371), a plurality of second vias 972 (e.g., the second vias 372), and a reinforcement portion 980 (e.g., the reinforcement portion 380). The first PCB 941 may include a first plate 942 (e.g., the first plate 342) having a first surface 942*a* (e.g., the first surface 342*a*) and a second surface 942*b* (e.g., the second surface 342*b*), and a hole 943 (e.g., the hole 343). The second PCB 951 may include a second plate 952 (e.g., the second plate 352) having a third surface 952*a* (e.g., the third surface 352*a*) and a fourth surface 952*b* (e.g., the fourth surface 352*b*). The interposer 961 may include a third plate 962 (e.g., the third plate 362) having a fifth surface 962*a* (e.g., the fifth surface 362*a*) and a sixth surface 962*b* (e.g., the sixth surface 362*b*). The reinforcement portion 980 may include a base 981 (e.g., the base 381), a pillar 982 (e.g., the pillar 382), a first flange 983 (e.g., the first flange 383), a second flange 984 (e.g., the second flange 384), a first pad 985 (e.g., the first pad 385), and a pair of second pads 986 (e.g., the second pads 386).

In an example embodiment, the reinforcement portion 980 may be at least partially coupled by engagement to the first plate 942. For example, the reinforcement portion 980 may include a first engagement element 988 formed on at least a portion of one side (e.g., a side surface) of the pillar 982. The first engagement element 988 may engage with a second engagement element 945 formed around the hole 943. In an example embodiment, the first engagement element 988 may be one of a male engagement element (e.g., a screw) and a female engagement element (e.g., a nut), and the second engagement element 945 may be the other one of the male engagement element (e.g., the screw) and the female engagement element (e.g., the nut). Meanwhile, although not shown, the structure of the reinforcement portion 980 as described above may also be formed on the second PCB 951.

Figure 10:
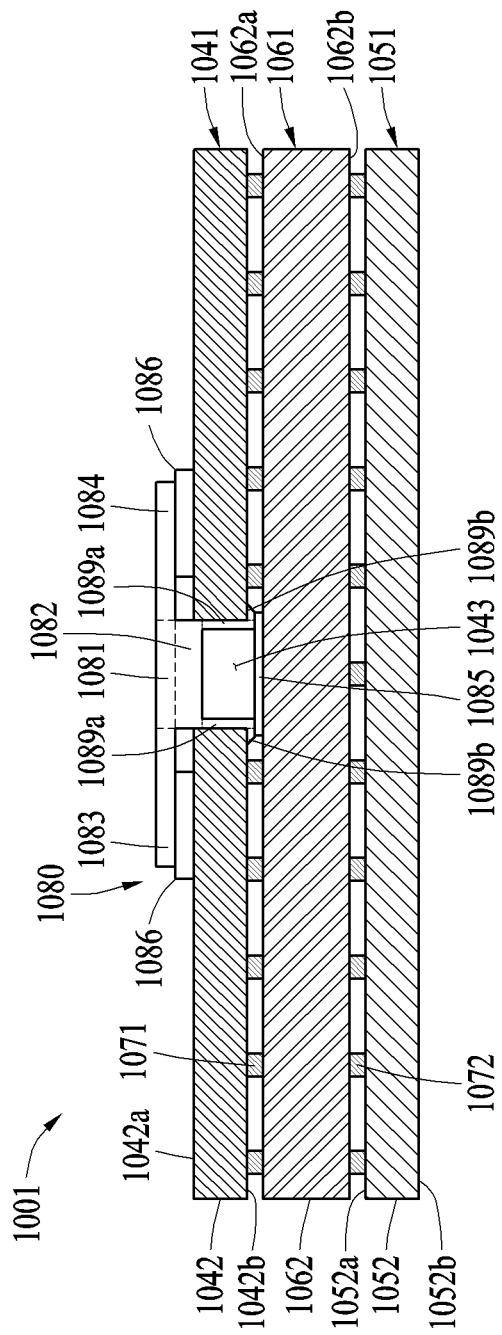
FIG. 10 is a cross-sectional view of stacked PCBs according to various embodiments.

Referring to FIG. 10, an electronic device 1001 (e.g., the electronic device 301) may include a first PCB 1041 (e.g., the first PCB 341), a second PCB 1051 (e.g., the second PCB 351), an interposer 1061 (e.g., the interposer 361), a plurality of first vias 1071 (e.g., the first vias 371), a plurality of second vias 1072 (e.g., the second vias 372), and a reinforcement portion 1080 (e.g., the reinforcement portion 380). The first PCB 1041 may include a first plate 1042 (e.g., the first plate 342) having a first surface 1042*a* (e.g., the first surface 342*a*) and a second surface 1042*b* (e.g., the second surface 342*b*), and a hole 1043 (e.g., the hole 343). The second PCB 1051 may include a second plate 1052 (e.g., the second plate 352) having a third surface 1052*a* (e.g., the third surface 352*a*) and a fourth surface 1052*b* (e.g., the fourth surface 352*b*). The interposer 1061 may include a third plate 1062 (e.g., the third plate 362) having a fifth surface 1062*a* (e.g., the fifth surface 362*a*) and a sixth surface 1062*b* (e.g., the sixth surface 362*b*). The reinforcement portion 1080 may include a base 1081 (e.g., the base 381), a pillar 1082 (e.g., the pillar 382), a first flange 1083 (e.g., the first flange 383), a second flange 1084 (e.g., the second flange 384), a first pad 1085 (e.g., the first pad 385), and a pair of second pads 1086 (e.g., the second pads 386).

In an example embodiment, the reinforcement portion 1080 may be at least partially and elastically coupled to the first plate 1042. For example, the pillar 1082 may be at least partially positioned in the hole 1043, and include, on one surface (e.g., a lower end surface) of the pillar 1082, at least one elastically deformable arm 1089*a* and at least one tab 1089*b* connected to the arm 1089*a* and coupled to the second surface 1042*b* of the first plate 1042. When the pillar 1082 is inserted into the hole 1043, the arm 1089*a* may elastically deform relative to an inner surface of the hole 1043, and the tab 1089*b* may be displaced in one direction (e.g., a radial direction) in the hole 1043 and move along the inner surface of the hole 1043 and then be positioned in an area around the hole 1043 on the second surface 1042*b*. In an example embodiment, the tab 1089*b* may be bonded to the fifth surface 1062*a* through the first pad 1085. In another example embodiment, at least a portion of the tab 1089*b* may be formed of a bonding portion of a conductive material, and the bonding portion may bond the tab 1089*b* and the fifth surface 1062*a*. Meanwhile, although not shown, the structure of the reinforcement portion 1080 as described above may also be formed on the second PCB 1051.

According to various example embodiments, an electronic device may include: a first printed circuit board (PCB) including a first plate and a first hole formed in the first plate, a second PCB including a second plate, an interposer including a third plate positioned between the first plate and the second plate, a plurality of first vias connecting the first plate and the third plate, a plurality of second vias connecting the second plate and the third plate, and a first reinforcement portion positioned in the first hole configured to bond the first plate and the third plate.

In an example embodiment, the first reinforcement portion may include: a first base positioned above the first hole, and a first pillar extending from the first base to be coupled to the first hole and bonded to the third plate.

In an example embodiment, the first reinforcement portion may further include a first pad positioned between the first pillar and the third plate to bond the first pillar and the third plate.

In an example embodiment, the first reinforcement portion may further include: a first flange connected to a first side of the first base, positioned on the first plate, and bonded to the first plate, and a second flange connected to a second side, opposite the first side, of the first base, positioned on the first plate, and bonded to the first plate.

In an example embodiment, the first reinforcement portion may further include a pair of second pads respectively positioned between the first flange and the first plate and between the second flange and the first plate to bond the first flange and the second flange to the first plate.

In an example embodiment, the plurality of first vias may be arranged in a plurality of rows on the third plate, and the first pad may be positioned in a first area between a pair of adjacent first vias in a first row of the plurality of rows and a second area between a pair of adjacent first vias in a second row of the plurality of rows, the second area being larger than the first area.

In an example embodiment, the plurality of first vias may be arranged in a single row on the third plate, and the first pad may be positioned in an area between a pair of adjacent first vias.

In an example embodiment, the second PCB may further include a second hole formed in the second plate, wherein the electronic device may further include a second reinforcement portion positioned in the second hole configured to bond the second plate and the third plate.

In an example embodiment, the second reinforcement portion may include: a second base positioned above the second hole, and a second pillar extending from the second base to be coupled to the second hole and bonded to the third plate.

In an example embodiment, the second reinforcement portion may further include a third pad positioned between the second pillar and the third plate to bond the second pillar and the third plate.

In an example embodiment, the second reinforcement portion may further include: a third flange connected to a first side of the second base, positioned on the second plate, and bonded to the second plate, and a fourth flange connected to a second side of the second base, positioned on the second plate, and bonded to the second plate.

In an example embodiment, the second reinforcement portion may further include a pair of fourth pads respectively positioned between the third flange and the second plate and between the fourth flange and the second plate to bond the third flange and the fourth flange to the second plate.

In an example embodiment, the first hole may have a first width or a first diameter, the first pillar may have a second width or a second width substantially equal to or less than the first width or the first diameter, and the first pillar may be coupled by fit to the first hole.

In an example embodiment, the first PCB may further include a recess formed in the first plate, and the first reinforcement portion may include: a first pillar coupled to the first hole, and a riveting portion configured to rivet the first pillar to the recess.

In an example embodiment, the first PCB may further include a first engagement element formed in the first hole, and the first reinforcement portion may include: a first pillar at least partially positioned in the first hole, and a second engagement element formed on the first pillar and configured to engage with the first engagement element.

In an example embodiment, the first reinforcement portion may include: a first pillar at least partially positioned in the first hole, an arm formed on the first pillar and elastically deformable, and a tab formed on the arm and coupled to one surface of the first plate.

According to various example embodiments, an electronic device may include: a first printed circuit board (PCB) including a first plate and a first hole formed in the first plate, a second PCB including a second plate, an interposer including a third plate positioned between the first plate and the second plate and a first pillar extending from the third plate to be coupled to the first hole, a plurality of first vias connecting the first plate and the third plate, a plurality of second vias connecting the second plate and the third plate, and a first reinforcement portion positioned in the first hole configured to bond the first plate and the first pillar.

In an example embodiment, the first reinforcement portion may include a first base positioned above the first hole and bonded to the first pillar.

In an example embodiment, the first reinforcement portion may further include a first pad positioned between the first pillar and the first base to bond the first pillar and the first base.

In an example embodiment, the first reinforcement portion may further include: a first flange connected to a first side of the first base, positioned on the first plate, and bonded to the first plate, and a second flange connected to a second side, opposite the first side, of the first base, positioned on the first plate, and bonded to the first plate.

In an example embodiment, the first reinforcement portion may further include a pair of second pads respectively positioned between the first flange and the first plate and between the second flange and the first plate to bond the first flange and the second flange to the first plate.

In an example embodiment, the second PCB may further include a second hole formed in the second plate, and the interposer may further include a second pillar extending from the third plate to be coupled to the second hole, wherein the electronic device may further include a second reinforcement portion positioned in the second hole to bond the second plate and the second pillar.

In an example embodiment, the second reinforcement portion may include a second base positioned above the second hole and bonded to the second pillar.

In an example embodiment, the second reinforcement portion may further include a third pad positioned between the second pillar and the second base to bond the second pillar and the second base.

In an example embodiment, the second reinforcement portion may further include: a third flange connected to a first side of the second base, positioned on the second plate, and bonded to the second plate, and a fourth flange connected to a second side of the second base, positioned on the second plate, and bonded to the second plate.

In an example embodiment, the second reinforcement portion may further include a pair of fourth pads respectively positioned between the third flange and the second plate and between the fourth flange and the second plate to bond the third flange and the fourth flange to the second plate.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device, comprising:
   a first printed circuit board (PCB) comprising a first plate and a first hole formed in the first plate;
   a second PCB comprising a second plate;
   an interposer comprising a third plate positioned between the first plate and the second plate;
   a plurality of first vias connecting the first plate and the third plate;
   a plurality of second vias connecting the second plate and the third plate; and
   a first reinforcement portion positioned in the first hole to bond the first plate and the third plate,
   wherein the first reinforcement portion comprises:
   a first base positioned above the first hole at a first side of the first PCB opposite a second side of the first PCB facing the interposer;
   a first pillar extending from the first base to be coupled to the first hole and bonded to the third plate;
   a first pad positioned between the first pillar and the third plate to bond the first pillar and the third plate, and
   wherein the plurality of first vias are arranged in a plurality of rows on the third plate, and
   wherein the first pad is positioned in a first area between a pair of adjacent first vias in a first row of the plurality of rows and a second area between a pair of adjacent first vias in a second row of the plurality of rows, the second area being larger than the first area.

2. The electronic device of claim 1, wherein the first reinforcement portion further comprises:
   a first flange connected to a first side of the first base, positioned on the first plate, and bonded to the first plate; and
   a second flange connected to a second side of the first base, opposite the first side of the first base, positioned on the first plate, and bonded to the first plate.

3. The electronic device of claim 2, wherein the first reinforcement portion further comprises a pair of second pads respectively positioned between the first flange and the first plate and between the second flange and the first plate to bond the first flange and the second flange to the first plate.

4. The electronic device of claim 1, wherein the plurality of first vias are arranged in a single row on the third plate, and the first pad is positioned in an area between a pair of adjacent first vias.

5. The electronic device of claim 1, wherein the second PCB further comprises a second hole formed in the second plate,
   wherein the electronic device further comprises a second reinforcement portion positioned in the second hole to bond the second plate and the third plate.

6. The electronic device of claim 5, wherein the second reinforcement portion comprises:
   a second base positioned above the second hole at a first side of the second PCB opposite a second side of the second PCB facing the interposer; and
   a second pillar extending from the second base to be coupled to the second hole and bonded to the third plate.

7. The electronic device of claim 6, wherein the second reinforcement portion further comprises a third pad positioned between the second pillar and the third plate to bond the second pillar and the third plate.

8. The electronic device of claim 6, wherein the second reinforcement portion further comprises:
   a third flange connected to a first side of the second base, positioned on the second plate, and bonded to the second plate; and
   a fourth flange connected to a second side of the second base, positioned on the second plate, and bonded to the second plate.

9. The electronic device of claim 8, wherein the second reinforcement portion further comprises a pair of fourth pads respectively positioned between the third flange and the second plate and between the fourth flange and the second plate to bond the third flange and the fourth flange to the second plate.

10. The electronic device of claim 9, wherein the first hole has a first width or a first diameter, the first pillar has a second width or a second width substantially equal to or less than the first width or the first diameter, and the first pillar is coupled by fit to the first hole.

11. An electronic device, comprising:
    a first printed circuit board (PCB) comprising a first plate and a first hole formed in the first plate;
    a second PCB comprising a second plate;
    an interposer comprising a third plate positioned between the first plate and the second plate and a first pillar extending from the third plate to be coupled to the first hole;
    a plurality of first vias connecting the first plate and the third plate;
    a plurality of second vias connecting the second plate and the third plate; and
    a first reinforcement portion positioned in the first hole to bond the first plate and the first pillar,
    wherein the first reinforcement portion comprises:
    a first base positioned above the first hole at a first side of the first PCB opposite a second side of the first PCB facing the interposer;
    the first pillar extending from the first base towards the third plate;
    a first pad positioned between the first pillar and the third plate to bond the first pillar and the third plate, and
    wherein the plurality of first vias are arranged in a plurality of rows on the third plate, and
    wherein the first pad is positioned in a first area between a pair of adjacent first vias in a first row of the plurality of rows and a second area between a pair of adjacent first vias in a second row of the plurality of rows, the second area being larger than the first area.

12. The electronic device of claim 11, wherein the first reinforcement portion further comprises:
    a first flange connected to a first side of the first base, positioned on the first plate, and bonded to the first plate; and
    a second flange connected to a second side of the first base, opposite the first side, of the first base, positioned on the first plate, and bonded to the first plate.

13. The electronic device of claim 12, wherein the first reinforcement portion further comprises a pair of second pads respectively positioned between the first flange and the first plate and between the second flange and the first plate to bond the first flange and the second flange to the first plate.

14. The electronic device of claim 11, wherein
the second PCB further comprises a second hole formed in the second plate, and
the interposer further comprises a second pillar extending from the third plate to be coupled to the second hole,
wherein the electronic device further comprises a second reinforcement portion positioned in the second hole to bond the second plate and the second pillar.

15. The electronic device of claim 14, wherein the second reinforcement portion comprises a second base positioned above the second hole at a first side of the second PCB opposite a second side of the second PCTB facing the interposer, and bonded to the second pillar.

* * * * *